United States Patent [19]

Marks

[11] Patent Number: 4,655,874
[45] Date of Patent: Apr. 7, 1987

[54] PROCESS FOR SMOOTHING A NON-PLANAR SURFACE

[75] Inventor: Steven Marks, San Antonio, Tex.

[73] Assignee: Advanced Micro Devices, Inc., Sunnyvale, Calif.

[21] Appl. No.: 759,625

[22] Filed: Jul. 26, 1985

[51] Int. Cl.[4] .......... B44C 1/22; C03C 15/00; C03C 25/06; B29C 17/08
[52] U.S. Cl. .................. 156/643; 156/646; 156/653; 156/655; 156/657; 156/659.1; 156/668; 156/904; 204/192.32; 427/88
[58] Field of Search .......... 204/192 EC, 192 E; 156/643, 646, 653, 655, 657, 659.1, 662, 668, 904; 427/88, 93; 29/576 W, 578, 591

[56] References Cited

U.S. PATENT DOCUMENTS 4,389,281 6/1983 Anantha et al. ............ 156/661.1 X
4,451,326 5/1984 Gwozdz .................... 156/656 X Primary Examiner—William A. Powell
Attorney, Agent, or Firm—Patrick T. King; John P. Taylor; J. Vincent Tortolano

[57] ABSTRACT

An improvement in the process of constructing an integrated circuit structure in which a photoresist layer is applied to an integrated circuit structure followed by plasma etching of the structure is disclosed which comprises exposing the photoresist material to light, preferably UV light, prior to the etching step whereby the surface of the structure beneath the photoresist will be smooth after the etching step and removal of the photoresist.

9 Claims, 5 Drawing Figures

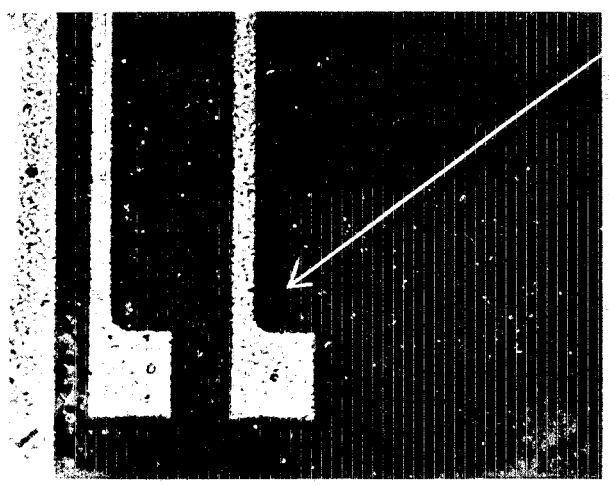
100X  (PRIOR ART)
FIG.4
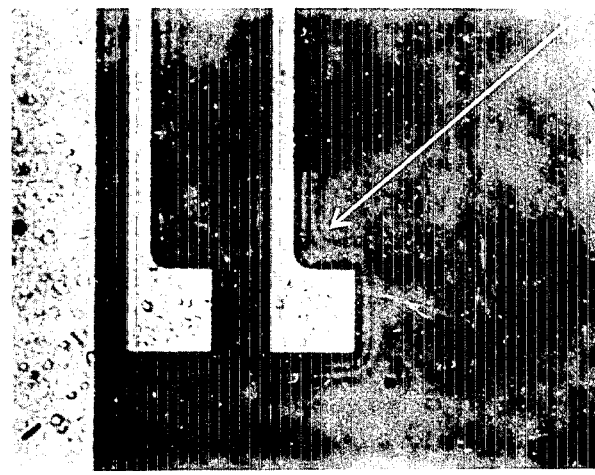
100X  FIG.5

PROCESS FOR SMOOTHING A NON-PLANAR SURFACE

BACKGROUND OF THE INVENTION

1. Field of the Invention

This invention relates to a method for processing integrated circuit structures. More particularly, this invention relates to an improved process to smooth a non-planar surface in an integrated circuit structure.

2. Description of the Prior Art

In the construction of high density integrated circuit structures, it is necessary to form many layers over the substrate. While the initial substrate is flat and smooth, the imposition of active devices, lead lines, contact vias, etc. thereon results in a non-planar surface with steps which must be smoothed out before subsequent layers maybe accurately applied. Planarization processes to accomplish such smoothing have become very important as the need for higher density integrated circuit structures has increased the number of layers utilized.

Gwozdz U.S. Pat. No. 4,451,326, assigned to the assignee of this invention, describes and claims a method for planarization wherein a sufficient amount of photoresist is deposited over an insulating layer having steps therein to fill in the low spots. The layers are then etched using an etchant which will remove both the photoresist material and the insulating material at about the same rate. This results in the removal of insulating material from the high spots while photoresist is removed from the low areas to thus smooth out the steps upon subsequent removal of the photoresist.

Thomas et al U.S. Pat. No. 4,481,070, also assigned to the assignee of this invention, describes and claims a double planarization process wherein a first insulating layer is planarized generally in accordance with the method described and claimed in the aforementioned Gwozdz patent and then a second insulating layer is applied over the first layer and the structure is again planarized.

While the foregoing methods are satisfactory to planarize the overall topography of the layers, it has been found, in some instances, that the surface of the insulating layer, after planarization, comes out with a roughened microtexture as shown in the photomicrograph of FIG. 1 which illustrates a surface after planarization by prior art processing.

It would be desirable to provide as smooth a surface as possible after such planarization to improve the lithography of subsequent layers formed over the planarized layer. It would be equally desirable to provide smooth surfaces in other applications including other applications where a photoresist is used as a mask in an etching process. Quite surprisingly, I have discovered a technique which eliminates the problem of roughened surfaces which may occur during certain processing of an integrated circuit structure which involves the use of photoresist.

SUMMARY OF THE INvENTION

It is therefore an object of this invention to provide an improved process for constructing integrated circuit structures wherein a photoresist layer is applied over at least a portion of such a structure prior to exposure to a dry etch which comprises exposing the photoresist to light prior to the etching step.

It is another object of this invention to provide an improved planarization process to smooth the topography of an integrated circuit structure which comprises applying a layer of photoresist material over the structure to be planarized and then exposing the photoresist layer to light prior to etching the structure which results in a smooth surface on the planarized structure.

It is a further object of this invention to provide an improved planarization process to smooth the topography of an integrated circuit structure which comprises applying a layer of photoresist material over the structure to be planarized and then exposing the photoresist layer to Uv light prior to etching the structure to obtain a smooth surface on the planarized structure.

These and other objects of the invention will be apparent from the following description and accompanying drawings.

In accordance with the invention an improvement in the process of constructing an integrated circuit structure in which a photoresist layer is applied to an integrated circuit structure followed by plasma etching of the structure, comprises exposing the photoresist material to light prior to the etching step whereby the surface of the structure beneath the photoresist will be smooth after the etching step and removal of the photoresist.

BRIEF DESCRIPTION OF THE DRAWINGS

FIG. 4 is a photomicrograph of the surface of an integrated circuit structure after prior art processing.

FIG. 5 is a photomicrograph of the surface of an integrated circuit structure after processing in accordance with the invention.

DESCRIPTION OF THE PREFERRED EMBODIMENTS

Figure 2:
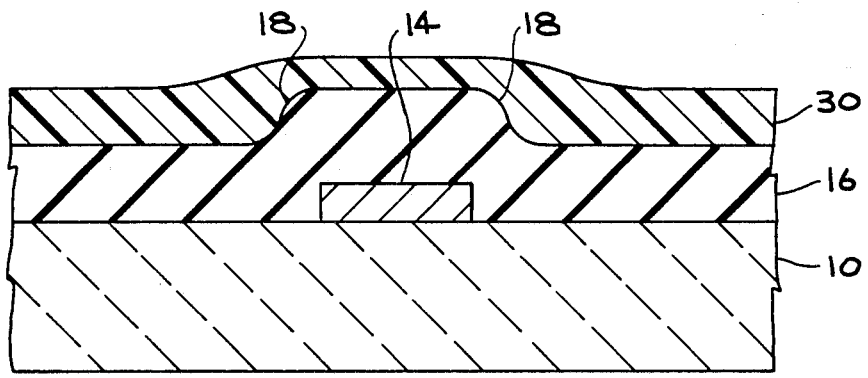
FIG. 2 is a fragmentary vertical cross-sectional view of an integrated circuit structure at one stage of the process.

In accordance with a preferred embodiment of the invention, the process of the invention may be used in connection with the planarization of the surface of an integrated circuit structure. As shown in FIG. 2, an integrated circuit structure generally indicated at 2 may comprise a substrate 10 having active devices (not shown) constructed therein and a metal line 14. A layer 16 of an etchable insulation material such as silicon dioxide is deposited over substrate 10 and metal line 14 leaving the step as shown at 18. A layer 30 of etchable photoresist material is then applied over layer 16 and heated to drive off solvents in the photoresist material and allow the photoresist material to smoothly flow over the surface of the underlying material so that the lowest areas are covered with a thicker portion of photoresist material 30.

Figure 1:
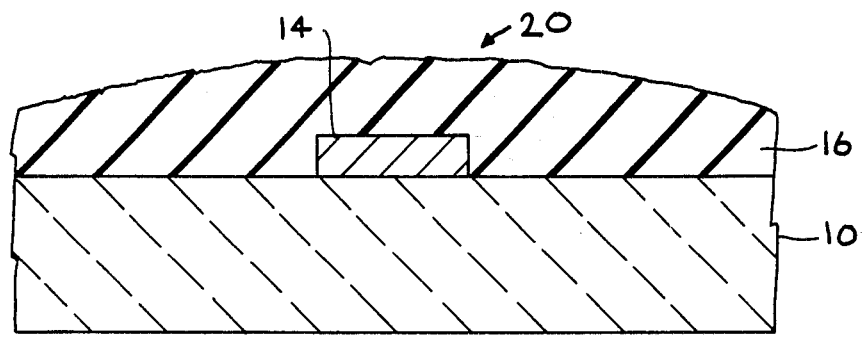
FIG. 1 is a fragmentary vertical cross-sectional view of the surface of an integrated circuit structure after prior art processing.

At this point in the prior art practice, an anisotropic dry etch, e.g., a plasma etch, would be carried out to remove an equal amount of material from the surface of the structure. At the high points of the surface, e.g., over metal line 14, all of photoresist layer 30 is removed to expose and allow partial etching of underlying layer 16. At the low points, however, only photoresist layer 30 is etched. Subsequent removal of the remainder of photoresist layer 30 results in a more planar topography. However, as seen in FIG. 1, the surface of the underlying layer, e.g., oxide layer 16, is rough with surface irregularities as indicated at the arrow 20.

Figure 3:
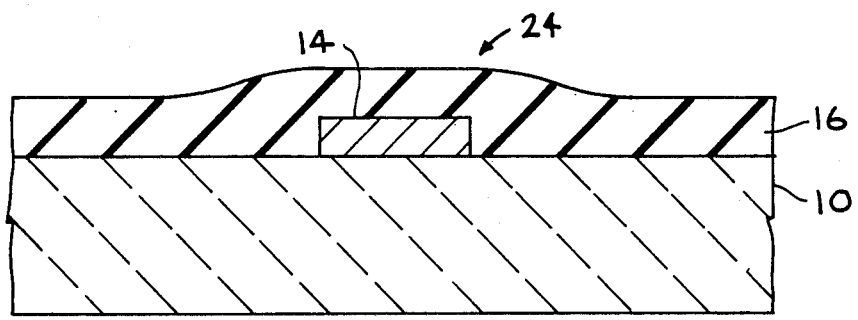
FIG. 3 is a fragmentary vertical cross-sectional view of an integrated circuit structure after completion of the process.

In contrast, as shown in FIG. 3, when the planarization is carried out in accordance with the invention, the resultant surface, as indicated at arrow 24, is smooth and does not have the prior art surface irregularities.

In accordance with the practice of the method of the invention, the photoresist material, after being heated to a temperature of from 150° to 200° C., preferably from 160° to 170° C., and most preferably about 165° C., for from about 5 to 30 minutes to flow the photoresist material over the underlying surface, is exposed to light prior to the anisotropic etch step. Preferably the light is in the ultra violet (UV) wavelength range since most photoresist materials are most responsive to light in this wavelength range.

While any photoresist material may be used which will be responsive to the same etch means used to remove portions of the underlying layer, positive photoresist materials such as Kodak 809 and American Azeotrope AZ111 are preferred due to the response of these materials to heat to smoothly flow the materials over the surface of the structure to be etched.

The anisotropic etch is preferably a plasma etch as is commonly used in such planarization processes. While I do not wish to be bound by any theories of operation, apparently the exposure of the positive photoresist material to ultraviolet light alters the structure of the photoresist material by polymerization sufficiently to provide some sort of protection of the surface of the underlying material from the effects of the plasma etch while the overlying photoresist material is being etched away, thus resulting in a smoother surface on the underlying layer.

Referring now to the photomicrographs of FIGS. 4 and 5, the surface of FIG. 4 at the arrow, representing prior art processing by coating silicon dioxide with Kodak 809 positive photoresist followed by plasma etching, is seen to be rough. In contrast, the surface of FIG. 5 at the arrow, which is also a silicon dioxide which was coated with Kodak 809 positive photoresist material; but which, however, was exposed to light in accordance with the invention, prior to etching with a plasma etch, is smooth and relatively free from surface irregularities.

While the improved process of the invention has been described in the context of a planarization process, it should be noted that the improvement of the invention may be applied to other processes used in the construction of integrated circuit structures which involve the application of a photoresist material onto such a structure following by a subsequent exposure to a high energy beam such as, for example, via etching, plasma aluminum etches, or deep implantation such as sinker implantation.

Thus, the invention provides an improvement in the processing of integrated circuit structures wherein a surface which is initially covered with photoresist material and then subsequently exposed to a high energy beam may be further protected by exposing the photoresist material to light prior to such high energy beam exposure whereby the underlying surface, after such high beam exposure will be smooth and substantially free of surface irregularities.

Having thus described the invention, what is claimed is:

1. An improvement in the process of planarizing an integrated circuit structure in which an etchable photoresist layer is applied over an etchable layer to be planarized on an integrated circuit structure followed by dry etching of both layers by exposure of the structure to a high energy beam which comprises exposing the photoresist material to light prior to said etching by said high energy source whereby the surface of the planarized layer beneath the photoresist layer will be smooth after said high energy etching and removal of the photoresist.

2. The process of claim 1 wherein said exposure to light comprises exposure to UV light.

3. The process of claim 1 including the additional step of heating said photoresist material to a temperature of from about 150° to 200° C. for from about 5 to 30 minutes to cause said photoresist to flow over said structure prior to said exposure to UV light.

4. The process of claim 3 wherein said heating step is carried out at a temperature range of from about 160° to 170° C.

5. The process of claim 4 wherein said step of exposing the structure to a high energy source comprises etching the structure with a plasma etch to planarize the surface of the structure.

6. An improved planarization process for smoothing the topography of an integrated circuit structure using a dry etchant which comprises:
   (a) applying a layer of photoresist material over a layer of etchable material on said structure;
   (b) heating said photoresist material to a temperature of from about 150° to 200° C. to cause said photoresist material to flow over said structure;
   (c) protecting the surface of said layer of etchable material by exposing said photoresist material to UV light to alter said layer of photoresist;
   (d) dry etching said photoresist material and said etchable material with a high energy plasma etch; and
   (e) removing the remaining portions of said photoresist material;
whereby the surface of the planarized layer of etchable material wil not be roughened by the effects of the high energy plasma beam.

7. The process of claim 6 wherein said heating step is carried out at a temperature range of from about 160° to 170° C.

8. An improved planarization process for smoothing the topography of an integrated circuit structure which comprises:
   (a) applying a layer of positive photoresist material over a layer of etchable material on said structure;
   (b) heating said photoresist material to a temperature of from about 160° to 170° C. for a period of from 5 to 30 minutes to cause said photoresist material to flow over said structure;
   (c) exposing said photoresist material to UV light;
   (d) etching said photoresist material and said etchable material with a plasma etch; and
   (e) removing said photoresist material; whereby the resultant surface beneath said photoresist material will be smooth and relatively free of surface irregularities.

9. The process of claim 8 wherein said etchable material under said photoresist material comprises an oxide of silicon.

* * * * *